(12) United States Patent  
Gilbert (10) Patent No.: US 9,977,051 B2  
(45) Date of Patent: May 22, 2018

(54) ELECTRICAL CONDUCTOR TESTING DEVICE

(71) Applicant: Fluke Corporation, Everett, WA (US)

(72) Inventor: John M. Gilbert, Seattle, WA (US)

(73) Assignee: Fluke Corporation, Everett, WA (US)

( * ) Notice: Subject to any disclaimer, the term of this patent is extended or adjusted under 35 U.S.C. 154(b) by 457 days.

(21) Appl. No.: 14/595,513

(22) Filed: Jan. 13, 2015

(65) Prior Publication Data

US 2016/0202291 A1    Jul. 14, 2016

(51) Int. Cl.
| | | |
|---|---|---|
| *G01N 27/416* | (2006.01) | |
| *G01R 1/04* | (2006.01) | |
| *G01R 19/00* | (2006.01) | |
| *G01R 15/14* | (2006.01) | |
| *G01R 15/18* | (2006.01) | |

(52) U.S. Cl.
CPC ......... *G01R 1/0416* (2013.01); *G01R 15/148* (2013.01); *G01R 15/181* (2013.01); *G01R 15/183* (2013.01); *G01R 19/0092* (2013.01)

(58) Field of Classification Search
USPC ....................................................... 324/429
See application file for complete search history.

(56) References Cited

U.S. PATENT DOCUMENTS

| | | | | |
|---|---|---|---|---|
| 4,553,799 A | * | 11/1985 | Deters ................. | H01R 31/085 439/507 |
| 2005/0275397 A1 | | 12/2005 | Lightbody et al. | |
| 2006/0047327 A1 | * | 3/2006 | Colvin ................. | A61B 5/076 607/60 |
| 2007/0063689 A1 | | 3/2007 | Baker et al. | |
| 2009/0251308 A1 | | 10/2009 | Schweitzer, III et al. | |
| 2011/0274139 A1 | * | 11/2011 | Woodard ............. | G01K 7/00 374/120 |
| 2012/0001617 A1 | | 1/2012 | Reynolds | |
| 2014/0035608 A1 | | 2/2014 | Mertens et al. | |
| 2014/0039838 A1 | * | 2/2014 | Katz .................... | G01R 1/04 702/188 |
| 2014/0111196 A1 | * | 4/2014 | Sakai .................. | G01R 15/205 324/252 |
| 2014/0293144 A1 | * | 10/2014 | Bae ..................... | G06F 3/041 349/12 |
| 2015/0002138 A1 | | 1/2015 | Fox | |

FOREIGN PATENT DOCUMENTS

EP    2 278 344 A2    1/2011

OTHER PUBLICATIONS

Extended European Search Report, dated Jun. 30, 2016, for European Application No. 16151116.7-1568, 7 pages.

* cited by examiner

*Primary Examiner* — Robert Grant
(74) *Attorney, Agent, or Firm* — Seed IP Law Group LLP (57) ABSTRACT

A testing device measures a characteristic of an electrical conductor. The testing device includes a substrate having at least one flexible portion, at least one sensor located on the substrate, and a holding mechanism. The at least one sensor is configured to generate a signal indicative of the characteristic of the electrical conductor. The holding mechanism is configured to hold the testing device to an outer portion of the electrical conductor such that the at least one sensor is held in a position with respect to the electrical conductor.

25 Claims, 9 Drawing Sheets

FIG. 7B

ELECTRICAL CONDUCTOR TESTING DEVICE

BACKGROUND

Current measurement is typically accomplished either by temporarily opening the circuit to be measured ("cut current") and inserting a sensing element in series, or by sensing the current without disrupting the circuit. Many methods and techniques exist to measure cut current. However, disrupting the circuit to measure the current requires the circuit to be turned off and turning off the circuit is not feasible in many applications.

Solutions have been developed to sense the current without disrupting the circuit. These solutions typically involve measuring a magnetic field generated by the circuit and estimating the current in the circuit based on the measured magnetic field. Devices that estimate current by measuring magnetic field are typically placed around electrical conductors to measure the magnetic field. Such devices include current clamps, Rogowski coils, electrical transformers, Hall effect sensors, and the like.

SUMMARY

The following summary is provided to introduce a selection of concepts in a simplified form that are further described below in the Detailed Description. This summary is not intended to identify key features of the claimed subject matter, nor is it intended to be used as an aid in determining the scope of the claimed subject matter.

In at least one embodiment, a testing device measures a characteristic of an electrical conductor. The testing device includes a substrate having at least one flexible portion, at least one sensor located on the substrate, and a holding mechanism. The at least one sensor is configured to generate a signal indicative of the characteristic of the electrical conductor. The holding mechanism is configured to hold the testing device to an outer portion of the electrical conductor such that the at least one sensor is held in a position with respect to the electrical conductor.

In one example, the outer portion of the electrical conductor comprises one or more of electrical shielding or insulation. In another example, the entire substrate is flexible. In another example, at least one sensor is located on the at least one flexible portion. In another example, the substrate comprises at least one rigid portion and the at least one sensor is located on the at least one rigid portion. In another example, the substrate comprises a plurality of rigid portions with the at least one flexible portion between the plurality of rigid portions. Where the substrate comprises a plurality of rigid portions, at least one of the plurality of rigid portions is a rigid printed circuit board and the at least one sensor is located on the rigid printed circuit board.

In one example, the testing device includes an electrical connection configured to be coupled to a computing device, where the computing device is configured to receive, via the electrical connection, the signal indicative of the characteristic of the electrical conductor generated by the at least one sensor. In another example, the testing device includes a wireless transmitter configured to send a wireless signal to a computing device and the wireless signal conveys information based on the signal indicative of the characteristic of the electrical conductor generated by the at least one sensor. A microprocessor can be configured to process the signal indicative of the characteristic of the electrical conductor generated by the at least one sensor and the wireless signal can include the processed signal indicative of the characteristic of the electrical conductor. In one example, the microprocessor is located on the substrate. In another example, a power source is located on the substrate and the power source is configured to power one or more of the wireless transmitter and the microprocessor.

In one example, the holding mechanism is configured to be wrapped around the electrical conductor. In another example, the testing device includes a spacer configured to be placed adjacent to the electrical conductor and a portion of the holding mechanism can be configured to be located around the electrical conductor and the spacer adjacent to the electrical conductor. In one example, the holding mechanism includes a spring mechanism. In another example, the testing device includes electromagnetic shielding located such that, when the holding mechanism holds the testing device to the outer portion of the electrical conductor, the at least one sensor is located between the electrical conductor and the electromagnetic shielding. In another example, the electromagnetic shielding is configured to attenuate an electromagnetic field generated by an electrical component other than the electrical conductor before the electromagnetic field reaches the at least one sensor.

In one example, at least one overlap marker is located on one of the substrate or the holding mechanism. In one example, a microprocessor is configured to determine an amount of overlap of the testing device based on a position of the at least one overlap marker when the substrate or the holding mechanism is located around the electrical conductor. In one example, the microprocessor is configured to determine an estimated size of the electrical conductor based on the amount of overlap. In another example, the at least one sensor includes a plurality of sensors. For example, the holding mechanism can be configured such that the sensors in the plurality of sensors are held in particular axial positions with respect to the electrical conductor.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

Current measurement devices placed around electrical conductors can measure a magnetic field induced by current flowing through the electrical conductors and estimate the amount of current in the electrical conductors based on the measured magnetic field. However, existing current measurement devices have several drawbacks. In one example, electrical conductors adjacent to an electrical conductor being measured may generate a magnetic field that interferes with the measurement of the magnetic field generated by the measured electrical conductor.

In another example, a current measurement device is calibrated to be placed around an electrical conductor such that the measurement is sufficiently accurate, but the current measurement device is not properly positioned with respect to the electrical conductor to be sufficiently accurate. Accuracy of current measurement devices may be diminished when the electrical conductor is not located in the calibrated position relative to the current measurement device. Existing current measurement devices may be calibrated with the conductor at a particular location, often central to the horizontal and vertical lines of symmetry to a jaw or clamp of the measurement device. If, in practice, the conductor is not located at the particular location, the resulting measurement will be inaccurate to some degree. Most efforts to address current measurement inaccuracy from improper positioning only reduce the inaccuracy to an acceptably low level.

In practical operation, a current measurement device may not be capable of being placed around an electrical conductor at a proper attitude. In some circumstances, it can be inconvenient or impossible to maintain a current measurement device at the proper attitude to obtain an acceptable accurate measurement, resulting in a less accurate measurement. In another example, a current measurement device may be properly placed with respect to an electrical conductor, left to measure the electrical connector for a long period of time, and lose its proper placement before the long period of time is completed.

Disclosed herein are various embodiments of testing devices with at least one sensor arranged on a flexible substrate and a holding mechanism that holds the testing device to an outer portion of an electrical conductor such that the at least one sensor is held in a proper position with respect to the electrical conductor. The holding mechanism is capable of maintaining the position of the at least one sensor with respect to the electrical conductor without human intervention. In various embodiments, the holding mechanism surrounds and grabs the electrical conductor with sufficient force to maintain the position of the at least one sensor with respect to the electrical conductor.

Using embodiments of the testing devices disclosed herein, the at least one sensor can be maintained in a calibration position with respect to the electrical conductor such that the accuracy of the at least one sensor is better than if the at least one sensor was not in the calibration position. Embodiments of the testing devices disclosed herein may include multiple sensors that increase accuracy over a single sensor and can be used in concert to cancel interfering electromagnetic fields (e.g., electromagnetic fields from neighboring electrical conductors and/or the environment). Furthermore, embodiments of the testing devices disclosed herein may determine position information to enable measuring a size of the electrical conductor. Signals from the at least one sensor can be processed based on the size of the electrical conductor to increase accuracy. Embodiments of the testing devices disclosed herein may also include electromagnetic shielding to decrease interference from interfering electromagnetic fields which increases the accuracy of the measurement by the at least one sensor. In addition, embodiments of the testing devices disclosed herein may be small (e.g., low profile) for ease of use and ease of centering the testing devices on electrical conductors.

Figure 1A:
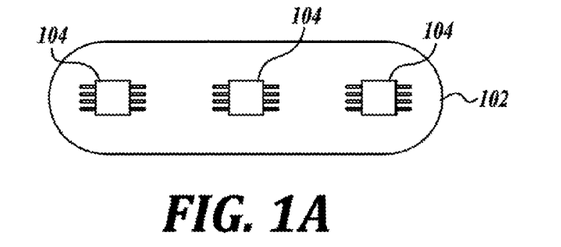
FIGS. 1A and 1B depict front and side views, respectively, of an embodiment of a flexible substrate in accordance with the embodiments of testing devices described herein.
Figure 1B:
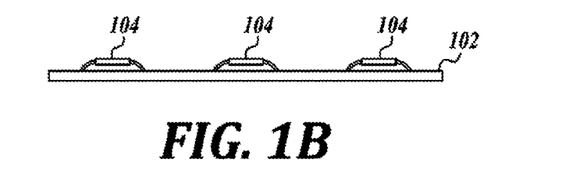

FIGS. 1A and 1B depict front and side views, respectively, of an embodiment of a flexible substrate 102. In the particular embodiment shown, the entire flexible substrate 102 is flexible, wherein the entire flexible substrate 102 is able to bend and/or twist. In one embodiment, the flexible substrate 102 includes electrical leads that are capable of electrically coupling electrical components located on the flexible substrate 102.

As shown in FIGS. 1A and 1B, a number of sensors 104 are located on the flexible substrate 104. The sensors 104 can be any type of electrical, magnetic, and/or electromagnetic sensors that are capable of sensing a characteristic of an electrical conductor. In the embodiment shown, each of the sensors 104 is located on the flexible substrate 104 and is electrically coupled to other sensors 104 via electrical leads in the flexible substrate 102. Each of the sensors 104 is capable of generating a signal indicative of the characteristic of the electrical conductor.

Figure 1C:
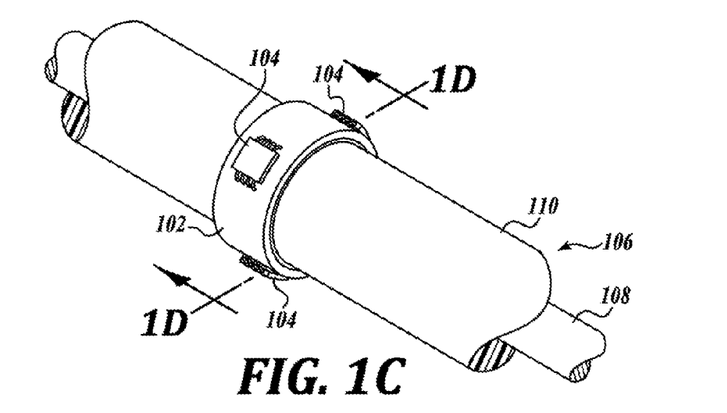
FIGS. 1C and 1D depict side and cross-sectional views, respectively, of the flexible substrate depicted in FIGS. 1A and 1B around an electrical conductor.
Figure 1D:
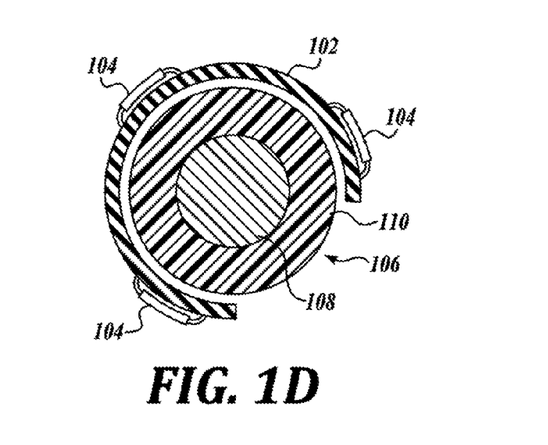

FIGS. 1C and 1D depict side and cross-sectional views, respectively, of the flexible substrate 102 positioned around an electrical conductor 106. The electrical conductor 106 includes a conductive core 108 and an outer portion 110. In one example, the conductive core 108 is made of strands of a conductive metal, such as copper. In one example, the outer portion 110 includes electrical shielding, insulation, or a combination of electrical shielding and insulation.

The flexible substrate 102 is sufficiently flexible to be bent around the electrical conductor 106 without losing any capability of or communication between the sensors 104. The sensors 104 are capable of generating a signal indicative of a characteristic of the electrical conductor 106. In one embodiment, the sensors are capable of sensing a magnetic field generated by current passing through the central core 108 of the electrical conductor 106. In one example, the sensors 104 generate a signal indicative of an estimated current passing through the central core 108. In another example, the sensors 104 generate a signal indicative of the magnetic field generated by current passing through the central core 108.

As shown in FIG. 1D, the sensors 104 are located at a particular position with respect to the electrical conductor 106. In one example, the sensors 104 are located at a calibration position with respect to the electrical conductor 106 that allows for a target level of accuracy from the measurement of the characteristic of the electrical conductor 106 by the sensors 104. As described in greater detail below, the flexible substrate 102 can be held by a holding mechanism such that the sensors 104 are held in position with respect to the electrical conductor 106.

Figure 2A:
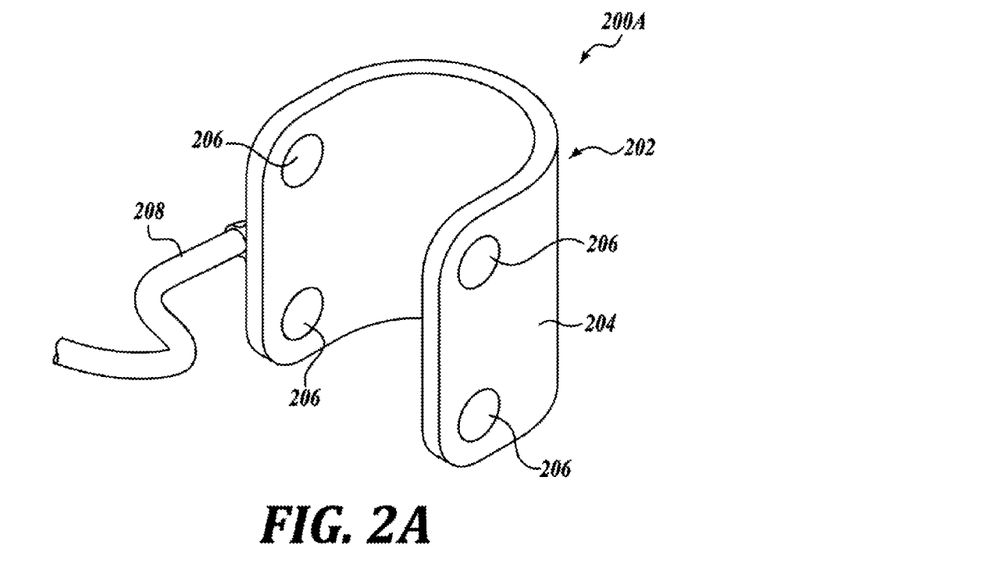
FIG. 2A depicts an embodiment of a holding mechanism in accordance with embodiments of testing devices described herein.

FIG. 2A depicts an embodiment of a holding mechanism 202 in accordance with embodiments the testing devices described herein. In this particular embodiment, the holding mechanism 202 includes a strap 204 that is configured to be wrapped around an electrical conductor. The strap 204 can be made out of any flexible material, such as polyester, leather, natural fabrics, and the like. In the embodiment shown in FIG. 2A, the strap 204 includes fasteners 206 that are configured to fasten two ends of the strap 204 after the strap is wrapped around the electrical conductor. In some examples, the fasteners 206 can be snaps, hook-and-loop (e.g., VELCRO) fabric, magnets, hook and eye fasteners, or any other type of releasable fastener. In various embodiments, when the strap 204 is wrapped around an electrical conductor and the fasteners 206 are fastened, the strap 204 is held securely to an outer portion of the electrical conductor. The holding mechanism 202 optionally includes an electrical connection 208 that is configured to be coupled to a computing device (not shown). In one example, a signal indicative of a characteristic of the electrical conductor generated by the at least one sensor is sent to and received by the computing device via the electrical connection 208.

In other embodiments of the holding mechanism 202 not depicted in FIG. 2A, the strap 204 may not include fasteners 206. In one example, the strap 204 is configured to grip the electrical conductor by being stretched around the conductor and then returning to its natural position. In another example, flexible metal tape is used to hold the strap 204 to the electrical conductor where the flexible metal tape can hold the strap 204 in an open position (i.e., in the position shown in FIG. 2A) and the flexible metal tape can be closed to wrap the strap 204 around the electrical conductor. Any other method or mechanism for holding strap 204 to an electrical conductor without fasteners 206 is possible.

Figure 2B:
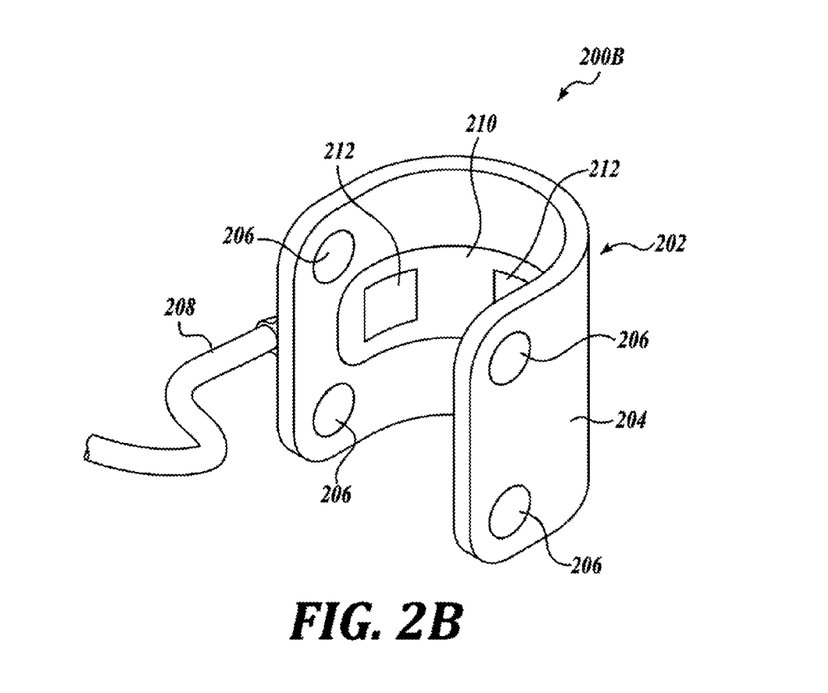
FIGS. 2B, 2C, and 2D depict embodiments of testing devices that include the holding mechanism depicted in FIG. 2A.

FIG. 2B depicts an embodiment of a testing device 200B that includes the holding mechanism 202 depicted in FIG. 2A. The testing device 200B includes the holding mechanism 202, a flexible substrate 210, and sensors 212 located on the flexible substrate 210. While the embodiment of the testing device 200B shown in FIG. 2B includes multiple sensors 212, other embodiments of the testing devices may include only one sensor. In one embodiment, the flexible substrate 210 is mechanically coupled to the strap 204, such as by one or more of a mechanical fastener, an adhesive, or stitching.

When the strap 204 is wrapped around an electrical conductor, the sensors 212 are positioned around the electrical conductor and the holding mechanism 202 holds the testing device 200 to an outer portion of the electrical conductor such that the sensors 212 are held in a position with respect to the electrical conductor. The sensors 212 generate a signal indicative of a characteristic of the electrical conductor. In one embodiment, the sensors 212 are electrically coupled to the electrical connection 208. In one example, the signal generated by the sensors 212 is sent to and received by a computing device via the electrical connection 208.

Figure 2C:
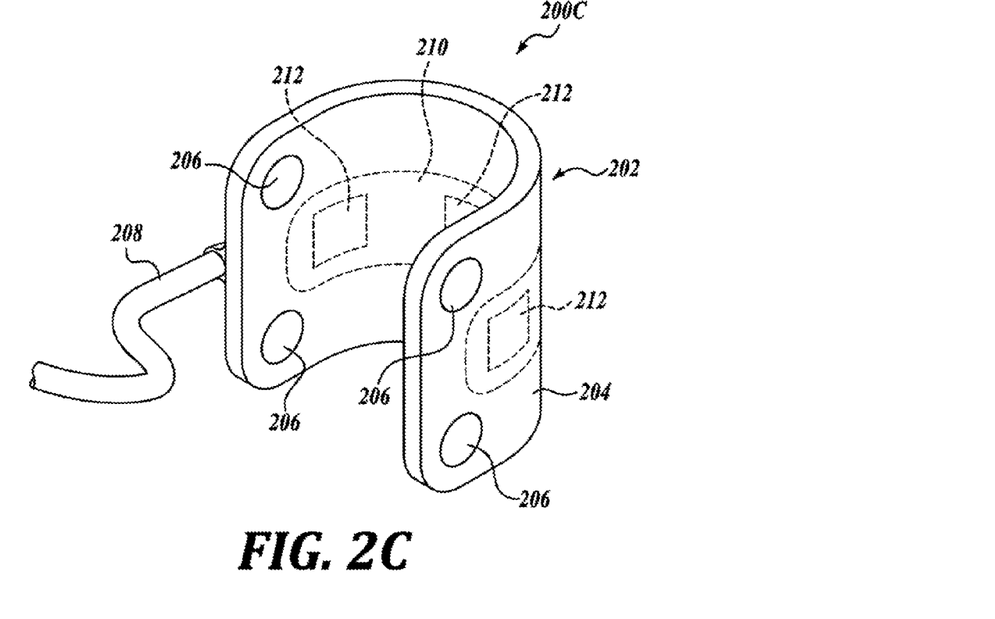

FIG. 2C depicts an embodiment of a testing device 200C that includes the holding mechanism 202 depicted in FIG. 2A. Just like the testing device 200B depicted in FIG. 2B, the testing device 200C depicted in FIG. 2C includes the flexible substrate 210 and the sensors 212 located on the flexible substrate 210. However, in the embodiment of the testing device 200C, the flexible substrate 210 and the sensors 212 are located inside of the strap 204. The positioning of the flexible substrate 210 and the sensors 212 inside of the strap 204 protects the flexible substrate 210 and the sensors 212 from damage while being handled and wrapped around electrical conductors. With the testing device 200C, the material of the strap 204 does not significantly affect electromagnetic fields such that the sensors 212 are capable of accurately measuring characteristics of magnetic fields.

Figure 2D:
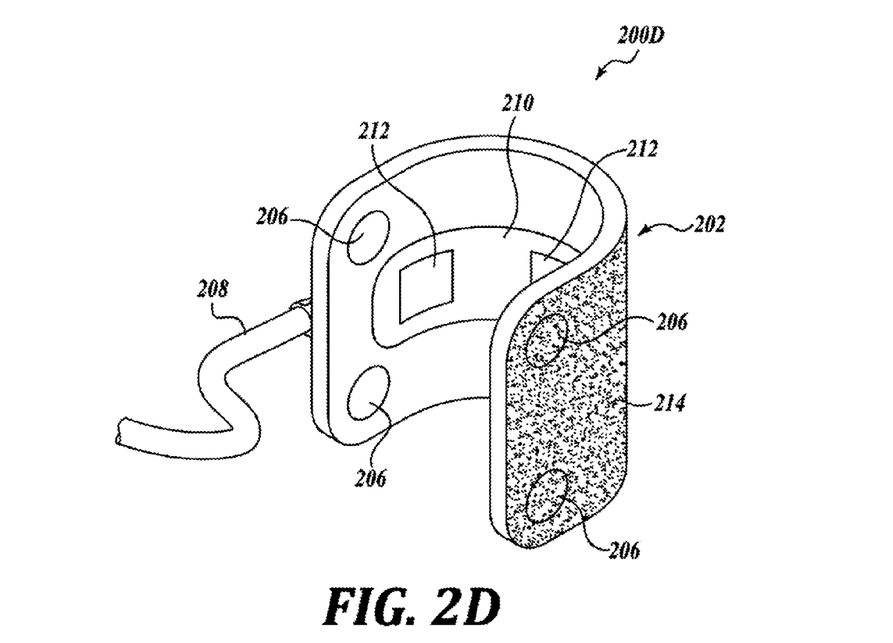

FIG. 2D depicts an embodiment of testing device 200D that includes the holding mechanism 202 depicted in FIG. 2A. The embodiment of the testing device 200D depicted in FIG. 2D is similar to the embodiment of the testing device 200B depicted in FIG. 2B in that the flexible substrate 210 and the sensors 212 located on the flexible substrate 210 are positioned on an inner surface of the strap 204. However, in the testing device 200D, electromagnetic shielding 214 is located on an outside surface of the strap 204. When the strap 204 is wrapped around an electrical conductor, the holding mechanism 202 holds the testing device 200D to the outer portion of the electrical conductor such that the sensors 212 are located between the electrical conductor and the electromagnetic shielding 214. The electromagnetic shielding 214 reduces electromagnetic interference from interfering electromagnetic fields (e.g., electromagnetic fields from neighboring electrical conductors and/or the environment). Reducing electromagnetic interference from interfering electromagnetic fields improves the accuracy of measurements of a characteristic of the electrical conductor taken by the sensors 212.

Figure 3A:
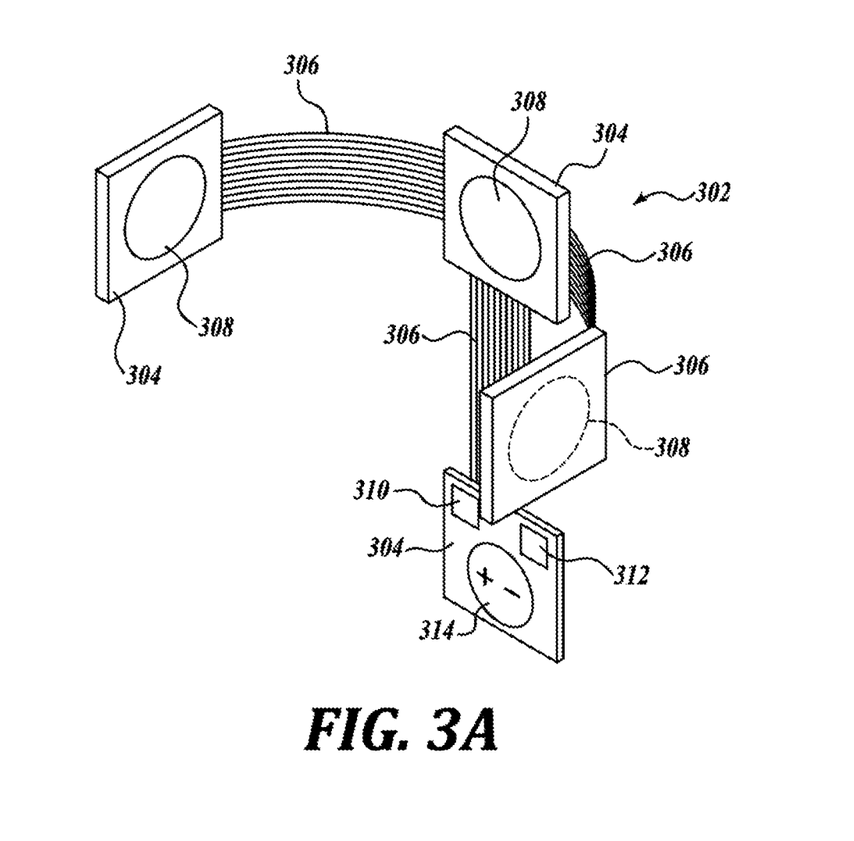
FIG. 3A depicts an embodiment of a flexible substrate that includes both flexible and rigid portions and that is usable with the embodiments of testing devices described herein.

FIG. 3A depicts an embodiment of a flexible substrate 302 usable with embodiments of the testing devices described herein. The flexible substrate 302 includes rigid portions 304 with flexible portions 306 between the rigid portions 304. Sensors 308 are located on the flexible substrate 302. In the depicted embodiment, the rigid portions 304 are rigid printed circuit boards and the sensors 308 are located on the rigid printed circuit boards. Other forms of rigid portions 304 are possible. In the depicted embodiment, the flexible portions 306 are ribbon cables electrically coupling the rigid printed circuit boards to each other.

In the embodiment depicted in FIG. 3A, a wireless transmitter 310, a microprocessor 312, and a power source 314 are located on one of the rigid portions 304. The wireless transmitter 310 can include one or more of a radio transmitter or transceiver, a Wi-Fi transmitter or transceiver, a Bluetooth transmitter or transceiver, or any other type of wireless transmitter or transceiver. In various embodiments, the microprocessor 312 includes one or more of analog circuitry, digital circuitry, a processing unit, a field-programmable gate array (FPGA), an application-specific integrated circuit (ASIC), or any other type of processing device. In one embodiment, the power source 314 includes one or more batteries.

In one embodiment, the wireless transmitter 310 is configured to send a wireless signal to a receiver coupled to a computing device. In one embodiment, the wireless signal is based on the signal indicative of a characteristic of an electrical conductor generated by the sensors 308. For example, in the case where the sensors 308 sense a magnetic field generated by a current passing along the electrical conductor, the wireless signal can include an indication of intensity of the sensed magnetic field, an indication of an estimated current level based on the sensed magnetic field, or any other information based on the sensed magnetic field.

In one embodiment, the microprocessor 312 is configured to process the signal indicative of the characteristic of the electrical conductor generated by the sensors 308. For example, the microprocessor 312 can generate an estimate of the current level based on the sensed magnetic field. In one embodiment, the wireless signal sent by the wireless transmitter 310 includes the processed signal indicative of the characteristic of the electrical conductor from the microprocessor 312.

One benefit to the embodiment of the flexible substrate 302 depicted in FIG. 3A is that the sensors 308, the wireless transmitter 310, and the microprocessor 312 can operate using the power provided by the power source 314 without being coupled to an external power source. The ability to operate without being coupled to an external power source allows the flexible substrate 302 to be used in circumstances that would be impractical or difficult to provide external power. In another embodiment, when an external power source is available, the wireless transmitter 310, the microprocessor 312, and the power source 314 can be omitted from the flexible substrate 302 to reduce the cost and complexity of the components on the flexible substrate 302.

Figure 3B:
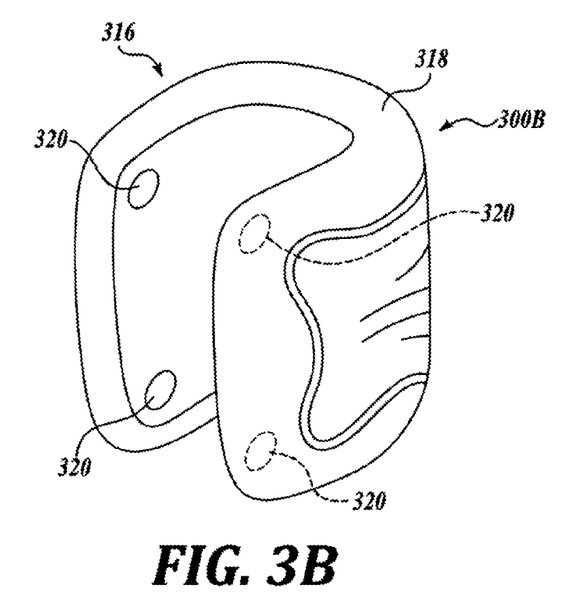
FIGS. 3B and 3C depict embodiments of testing devices in accordance with embodiments described herein.
Figure 3C:
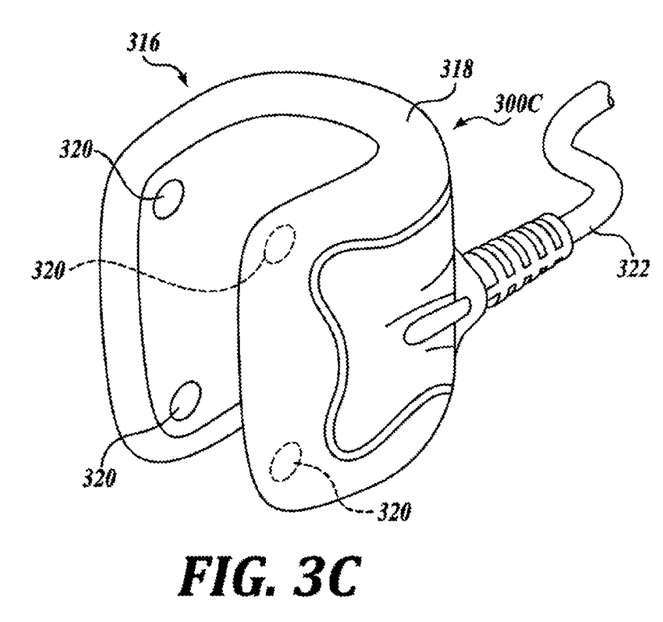

FIGS. 3B and 3C depict examples of testing devices 300B and 300C, respectively. The testing devices 300B and 300C include a holding mechanism 316. The holding mechanism 316 includes a U-shaped sleeve 318. In one embodiment, the U-shaped sleeve 318 is filled with a gel or foam that is moldable while still maintaining the U-shape form of the U-shaped sleeve 318. The embodiment of the holding mechanism 316 depicted in FIGS. 3B and 3C also includes fasteners 320. In practice, an electrical conductor can be placed inside the U-shape sleeve 318 and the fasteners 320 can be coupled such that the holding mechanism 316 holds the testing device 300B or 300C to an outer portion of the electrical conductor. In other embodiments not shown in FIGS. 3B and 3C, holding mechanism 316 may not include fasteners 320.

In one embodiment, flexible substrate 302 and the sensors 308, the wireless transmitter 310, and the microprocessor 312 located on the flexible substrate 302 are held within the U-shaped sleeve 318 of the testing device 300B. Any filling within the U-shaped sleeve 318 (e.g., gel or foam) may protect the flexible substrate 302, the sensors 308, the wireless transmitter 310, and the microprocessor 312 from physical damage. When an electrical conductor is placed inside the U-shaped sleeve 318 and the fasteners 320 are coupled, the holding mechanism 316 holds the testing device 300B to an outer portion of the electrical conductor such that the sensors 308 are held in a position with respect to the electrical conductor. The sensors 308 generate a signal indicative of the characteristic of the electrical conductor. In one embodiment, the microprocessor 312 processes the signal indicative of the characteristic of the electrical conductor generated by the sensors 308. In another embodiment, the wireless transmitter 310 sends a wireless signal to a computing device, where wireless signal is based on the signal indicative of the characteristic of the electrical conductor generated by the sensors 308. In one example, the wireless signal includes the processed signal indicative of the characteristic of the electrical conductor.

The testing device 300C may include an electrical connection 322 that is capable of being coupled to a computing device. The electrical connection 322 is electrically coupled to the flexible substrate 302. In one embodiment, the electrical connection 322 provides power from the computing device to power one or more components on the flexible substrate 302. In another embodiment, the computing device is configured to receive the signal indicative of the characteristic of the electrical conductor generated by the sensors 308 via the electrical connection 322. In one embodiment where the testing device 300C includes the electrical connection 322, the flexible substrate 302 does not include one or more of the wireless transmitter 310, the microprocessor 312, or the power source 314. Each of the functions of the wireless transmitter 310, the microprocessor 312, or the power source 314 can be provided by the electrical connection 322 (e.g., providing power via electrical connection 322), performed by the computing device (e.g., processing of the signal generated by the sensors 308), or rendered unnecessary by the electrical connection 322 (e.g., the wireless transmission to the computing device).

Figure 4A:
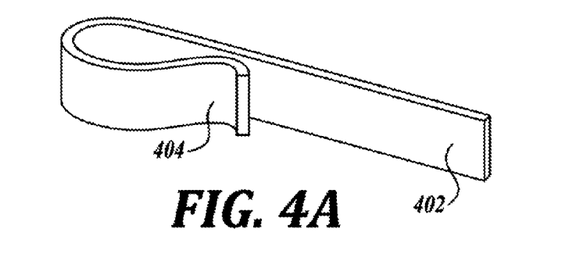
FIGS. 4A, 4B, and 4C depict, respectively, an embodiment of a holding mechanism, an embodiment of a spacer, and an embodiment of a flexible substrate, in accordance with embodiments of testing devices described herein.
Figure 4B:
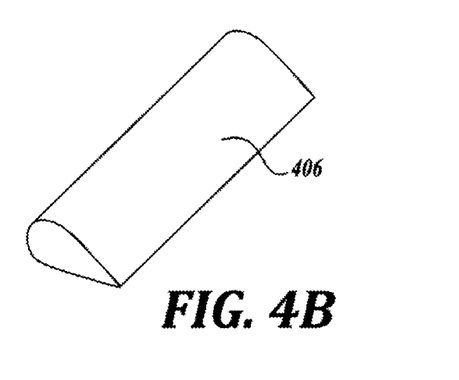
Figure 4C:
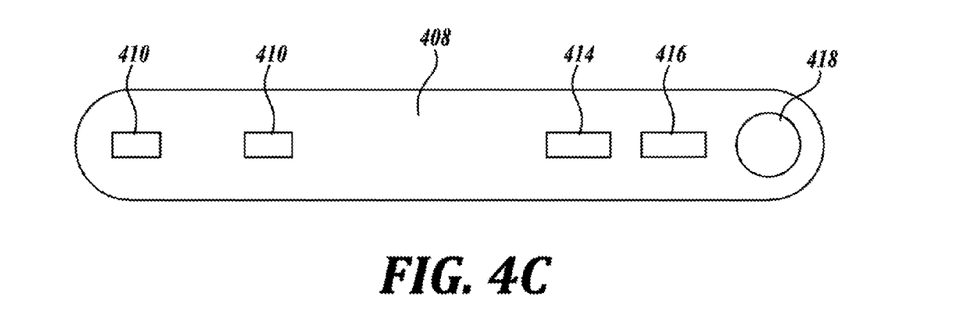

FIG. 4A depicts a perspective view of an embodiment of a holding mechanism 402. The holding mechanism 402 includes a spring mechanism 404 in the form of a spring clip configured to bias a portion of the testing device 402 toward the electrical conductor. For example, the electrical conductor can be placed inside the curved portion of the holding mechanism 402 formed by the spring clip to hold the electrical conductor. FIG. 4B depicts a perspective view of an embodiment of a spacer 406 that can be used in conjunction with the holding mechanism 402. In one embodiment, the spacer 406 is filled with a compliant material, such as a gel, a liquid, a gas, non-rigid foam, and the like, that does not interfere with measurements made by the sensors 410. FIG. 4C depicts a front view of a flexible substrate 408. Sensors 410 are located on the flexible substrate 408. Optionally, other components, such as a wireless transmitter 414, a microprocessor 416, or a power source 418, can also be located on the flexible substrate. In one embodiment, the flexible substrate 408 includes electrical leads that couple the sensors 410 to each other and to any other components on the flexible substrate 408.

Figure 4D:
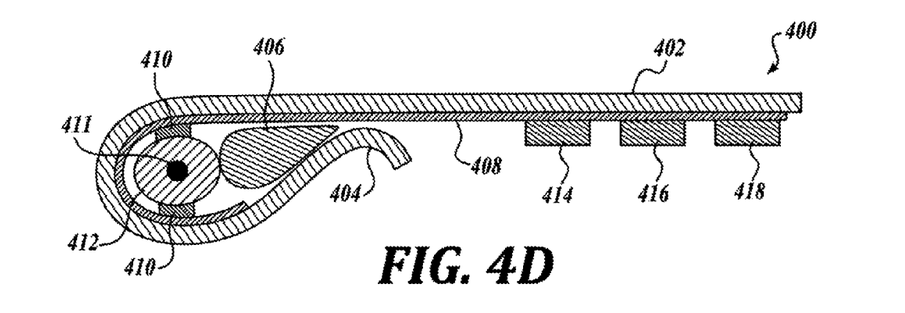
FIG. 4D depicts a side view of a testing device that includes the embodiment of the holding mechanism, the embodiment of the spacer, and the embodiment of the flexible substrate depicted in FIGS. 4A, 4B, and 4C.

FIG. 4D depicts a side view of a testing device 400 that includes the flexible substrate 408, the sensors 410, and the holding mechanism 402. The flexible substrate 408 is located against an inner surface of the holding mechanism 402. In one example, the flexible substrate 408 is affixed (e.g., adhered) to the inner surface of the holding mechanism 402. The sensors 410 are located on the flexible substrate 408 inside of the spring clip of the holding mechanism 402. An electrical conductor 412 having a conductive core 411 is also located inside of the spring clip of the holding mechanism 402. The holding mechanism 402 holds the testing device 400 to an outer portion of the electrical conductor 412 such that the sensors 410 are held in a position with respect to the electrical conductor 412. For example, each of the sensors 410 is held in a particular axial position with respect to the electrical conductor 412. In the particular embodiment shown in FIG. 4D, the sensors 410 are held in axial positions substantially opposite of each other with respect to the electrical conductor 412.

Furthermore, in the embodiment shown in FIG. 4D, the spacer 406 is placed adjacent to the electrical conductor 412. A portion of the holding mechanism 402 (e.g., the portion formed by the spring clip) is located around the electrical conductor 412 and the spacer 406 is held adjacent to the electrical conductor 412. In one embodiment, the spacer 406 is configured to occupy space within the portion of the holding mechanism 402 formed by the spring clip such that the sensors 410 are held in position with respect to the electrical conductor 412.

Figure 5A:
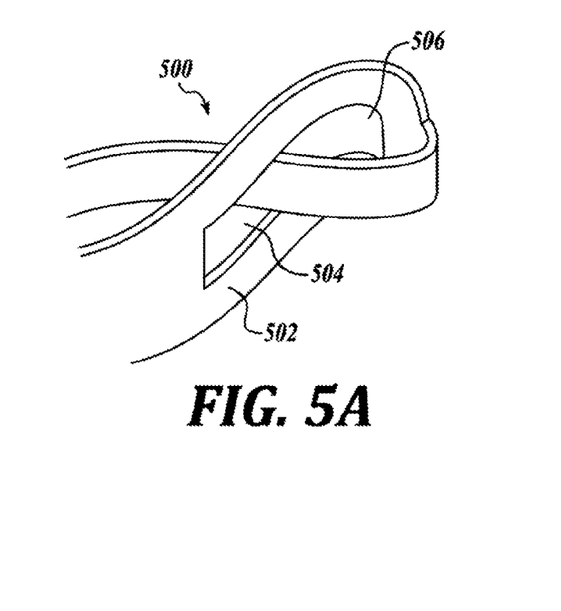
FIGS. 5A to 5C depict embodiments of holding mechanisms usable in accordance with embodiments of testing devices described herein.
Figure 5B:
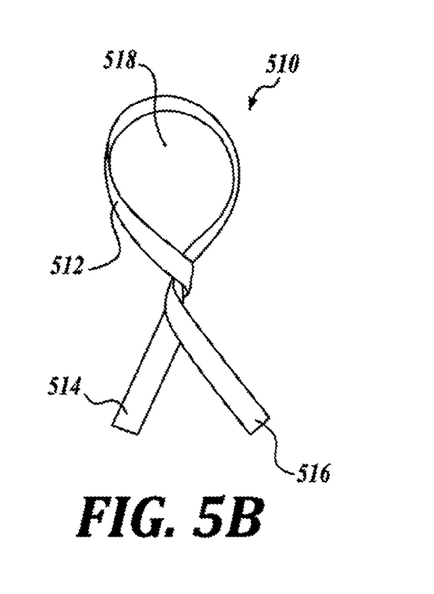
Figure 5C:
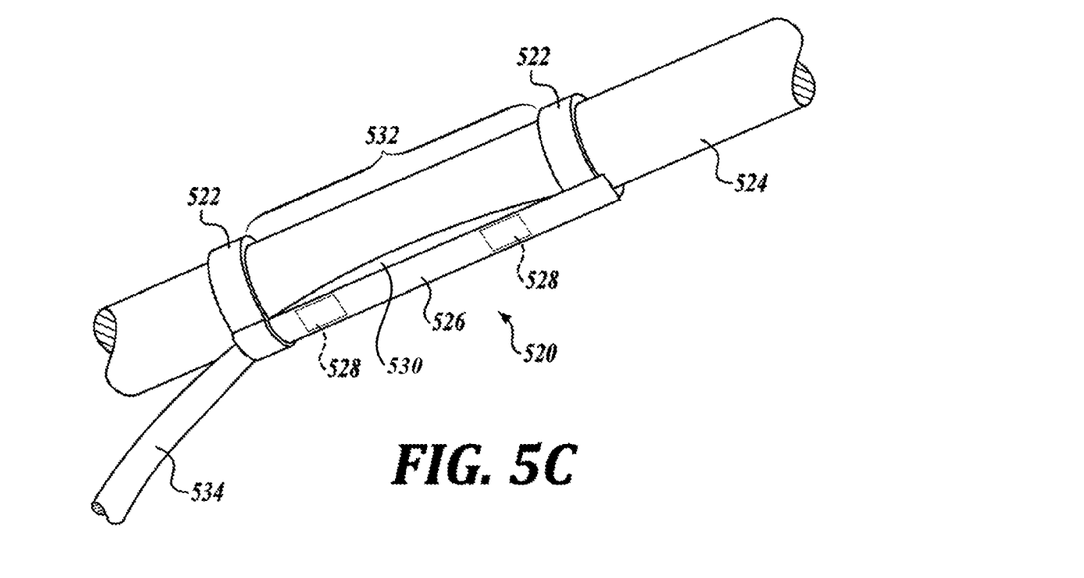

FIGS. 5A to 5C depict embodiments of holding mechanisms usable in accordance with embodiments of the testing devices described herein. FIG. 5A depicts an embodiment of a holding mechanism 500 in the form of a hook-and-loop strap 502. The strap 502 includes a slat 504. One end of the strap 502 can be fed through the slat 504 to form a loop 506. The ends of the strap 502 can be secured to each other using hook-and-loop fasteners of the strap 502. In one embodiment, one end of the strap 502 is passed around an electrical conductor and fed through the slat 504 such that the electrical conductor is located within the loop 506. The end of the strap 502 is secured using the hook-and-loop fasteners of the strap 502 to hold the electrical conductor. In one embodiment, at least one sensor is located on a flexible substrate that is located within the strap 502 such that the at least one sensor is in a position in the loop 506 and held with respect to the electrical conductor by the holding mechanism 500. In another embodiment, at least one sensor is located on a flexible substrate that is located within the loop 506 such that the holding mechanism 500 holds the flexible substrate against the electrical conductor inside the loop 506.

FIG. 5B depicts an embodiment of a holding mechanism 510 in the form of a tie 512. In one embodiment, the tie 512 includes a metal wire that is encased in a thin strip of paper or plastic. The tie includes two ends 514 and 516. In one embodiment, the ends 514 and 516 can be twisted around each other to form a loop 518. The twisting of the ends 514 and 516 secures the tie in the shape with the loop 518. In one embodiment, one of the ends 514 and 516 is passed around an electrical conductor, after which the ends 514 and 516 are twisted around each other such that the electrical conductor is located within the loop 518. In one embodiment, at least one sensor is located on a flexible substrate that is located within the tie 512 such that the at least one sensor is in a position in the loop 518 and held with respect to the electrical conductor by the holding mechanism 510. In another embodiment, at least one sensor is located on a flexible substrate that is located within the loop 518 such that the holding mechanism 510 holds the flexible substrate against the electrical conductor inside the loop 518.

FIG. 5C depicts an embodiment of a holding mechanism 520. The holding mechanism 520 includes two straps that are capable of grasping an electrical conductor 524. A flexible substrate 526 is located between the straps 522 of the holding mechanism 520. One or more sensors 528 are located on the flexible substrate and are capable of generating a signal indicative of the characteristic of the electrical conductor 524. The holding mechanism 520 includes a spring mechanism 530 that is configured to bias the electrical conductor 524 such that a portion 532 of the electrical conductor 524 between the straps 522 is taut. In one embodiment, the action of the spring mechanism 530 holds the portion 532 of the electrical conductor 524 at a particular location with respect to the sensors 528. In the particular embodiment shown in FIG. 5C, the holding mechanism 520 includes an electrical connector 534 that can be coupled to a computing device.

Figure 6A:
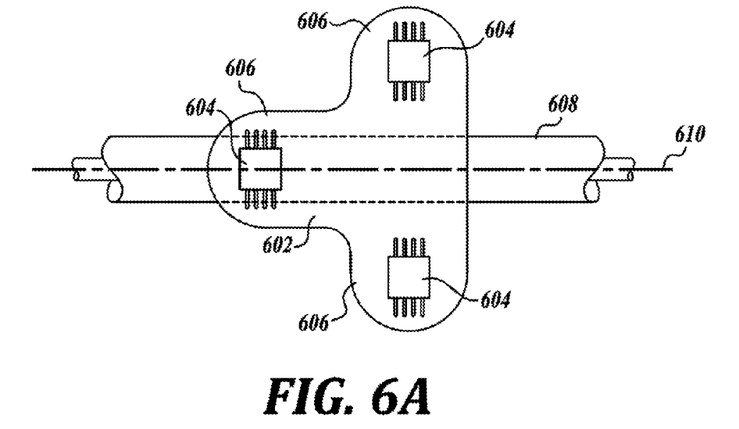
FIGS. 6A and 6B depict embodiments of flexible substrates usable in accordance with embodiments of testing devices described herein.
Figure 6B:
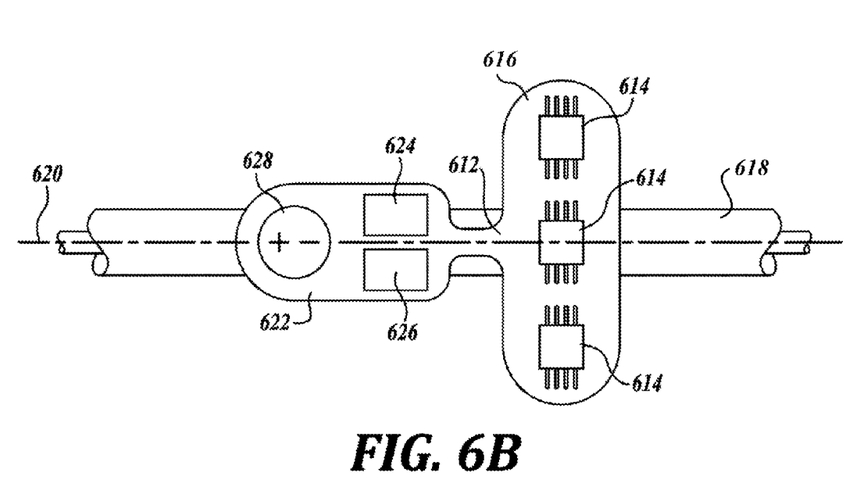

FIGS. 6A and 6B depict embodiments of flexible substrates usable in accordance with embodiments of the testing devices described herein. FIG. 6A depicts an embodiment of a flexible substrate 602 and sensors 604 located on the flexible substrate 602. The flexible substrate 602 is capable of being bent around an electrical conductor 608. In the particular embodiment shown in FIG. 6A, the flexible substrate 602 includes wings 606 that are capable of being bent around an electrical conductor 608. In one example, the size of the flexible substrate 602 and/or the locations of the sensors 604 on the flexible substrate 602 are determined such that, when the flexible substrate 602 is held by a holding mechanism, the sensors 604 are located at particular axial positions with respect to an axis 610 of the electrical conductor 608.

FIG. 6B depicts an embodiment of a flexible substrate 612. Sensors 614 are located on a first portion 616 of the flexible substrate 612. The first portion 616 of the flexible substrate 612 is capable of being bent around an electrical conductor 618. In one example, the size of the first portion 616 of the flexible substrate 612 and/or the locations of the sensors 614 on the first portion 616 of the flexible substrate 612 are determined such that, when the first portion 616 of the flexible substrate 612 is held by a holding mechanism, the sensors 614 are located at particular axial positions with respect to an axis 620 of the electrical conductor 618. The flexible substrate 612 includes a second portion 622. Optionally, other components, such as wireless transmitter 624, microprocessor 626, and power source 628, are located on the second portion 622 of the flexible substrate 612. In one example, the second portion 622 of the flexible substrate 612 is a rigid portion of the flexible substrate 612, such as a rigid printed circuit board. In one embodiment, a holding mechanism is configured to hold the first portion 616 of the flexible substrate 612 to an outer portion of the electrical conductor 618 such that the sensors 614 are held in a position with respect to the electrical conductor 618. In one example, the holding mechanism does not hold the second portion 622 of the flexible substrate 612 to the outer portion of the electrical conductor 618.

Figure 7A:
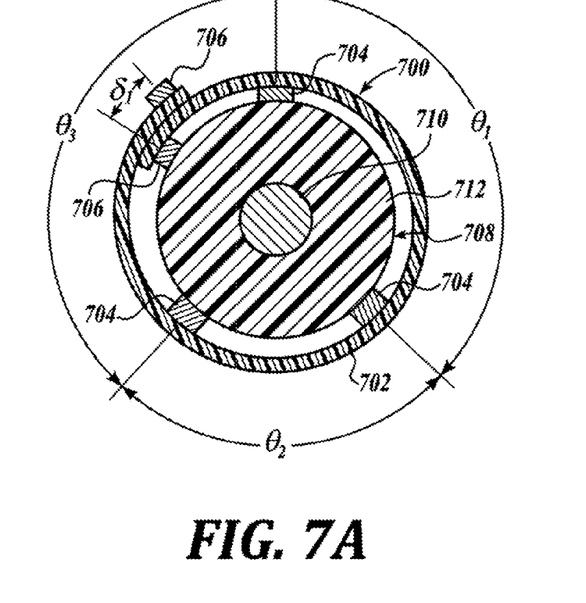
FIGS. 7A and 7B depict cross-sectional views of embodiments of a testing device around electrical conductors, in accordance with embodiments of testing devices described herein.
Figure 7B:
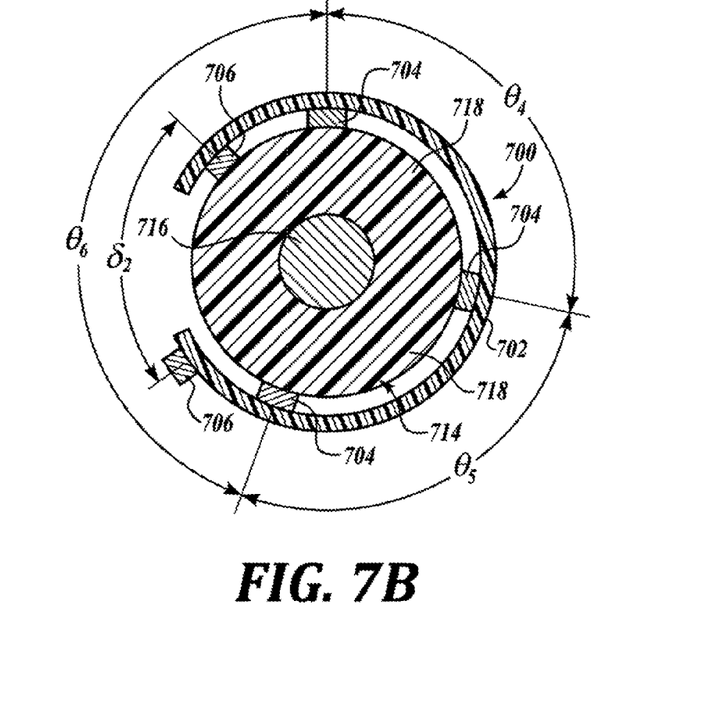

FIGS. 7A and 7B depict cross-sectional views of embodiments of a testing device 700 positioned around electrical conductors 708 and 714, respectively. In both embodiments, the testing device 700 includes a flexible substrate 702 with sensors 704 located on the flexible substrate 702. The testing device 700 may also include a holding mechanism that is not shown in FIGS. 7A and 7B.

In the embodiments shown in FIGS. 7A and 7B, the testing device 700 also includes two overlap markers 706. The overlap markers 706 are usable to determine an amount of overlap δ of the testing device 700 when the testing device 700 is positioned around the electrical conductors 708 and 714. While the overlap markers 706 depicted in FIGS. 7A and 7B are located on the flexible substrate 702, overlap markers can, in other embodiments, be located on a holding mechanism. In addition, while the embodiments depicted in FIGS. 7A and 7B include multiple overlap markers 706, a single overlap marker can also be used.

In one embodiment, one of the overlap markers is a magnet and another of the overlap markers is a magnetic sensor that determines an amount of overlap δ of based on the strength of a magnetic field. In another embodiment, one of the overlap markers is configured to emit or reflect wireless signals (e.g., near field communication (NFC) signals, radio frequency identification (RFID) signals, etc.) and another of the overlap markers is a wireless receiver that determines an amount of overlap δ of the testing device based on the strength of the received wireless signal. The overlap markers 706 can take any number of other forms that can be used to determine an amount of overlap δ of the testing device 700. In one embodiment, a microprocessor (not shown in FIGS. 7A and 7B) determines an amount of overlap δ of the testing device based on the position of one or more of the overlap markers. For example, the microprocessor is configured to determine an estimated size of an electrical conductor based on the amount of overlap δ.

In FIG. 7A, the testing device 700 is positioned around electrical conductor 708. The electrical conductor 708 includes a conductive core 710 and an outer portion 712. The testing device 700 is located around the electrical conductor 708 with ends of the testing device 700 overlapping each other. Based on positions of one or more of the overlap markers 706, an amount of overlap $\delta_1$ of the testing device 700 can be determined. In one example, the amount of overlap $\delta_1$ is a positive number because the ends of the testing device 700 overlap each other. In one embodiment, an estimated size of the electrical conductor 708 can be determined based on the amount of overlap $\delta_1$. For example, the amount of overlap $\delta_1$ can be used to estimate a diameter of the outer portion 712 of the electrical conductor 708. In another example, a gauge of the central core 710 of the electrical conductor 708 can be determined based on the estimate of the diameter of the outer portion 712 of the electrical conductor 708.

In another embodiment, an angular orientation of the sensors 704 positioned around the electrical conductor 708 is determined based on the amount of overlap $\delta_1$. For example, one or more of the angles $\theta_1$, $\theta_2$, and $\theta_3$ is determined based on the amount of overlap $\delta_1$ and the known distances between the sensors 704 on the flexible substrate 702. Any of the information determined based on the amount of overlap $\delta_1$ (e.g., a gauge of the central core 710, the angular orientation of the sensors 704, etc.) can be used in processing signals from the sensors 704 to improve accuracy of the sensed characteristic of the electrical conductor 708.

In FIG. 7B, the testing device 700 is positioned around electrical conductor 714. The electrical conductor 714 includes a conductive core 716 and an outer portion 718. Because the electrical conductor 714 is bigger than the electrical conductor 708, the ends of the testing device 700 do not overlap each other, as illustrated in FIG. 7B. Based on positions of one or more of the overlap markers 706, an amount of overlap $\delta_2$ of the testing device 700 can be determined. In one example, the amount of overlap $\delta_2$ is a negative number because the ends of the testing device 700 do not overlap each other. In one embodiment, an estimated size of the electrical conductor 714 can be determined based on the amount of overlap $\delta_2$. For example, the amount of overlap $\delta_2$ can be used to estimate a diameter of the outer portion 718 of the electrical conductor 714. In another example, a gauge of the central core 716 of the electrical conductor 714 can be determined based on the estimate of the diameter of the outer portion 718 of the electrical conductor 714.

In another embodiment, an angular orientation of the sensors 704 positioned around the electrical conductor 714 is determined based on the amount of overlap $\delta_2$. For example, one or more of the angles $\theta_4$, $\theta_5$, and $\theta_6$ is determined based on the amount of overlap $\delta_2$ and the known distances between the sensors 704 on the flexible substrate 702. Any of the information determined based on the amount of overlap $\delta_2$ (e.g., a gauge of the central core 716, the angular orientation of the sensors 704, etc.) can be used in processing signals from the sensors 704 to improve accuracy of the sensed characteristic of the electrical conductor 714.

While various illustrative embodiments have been illustrated and described above, it will be appreciated that various changes can be made therein without departing from the spirit and scope of the claimed subject matter as defined by the following claims.

The embodiments of the invention in which an exclusive property or privilege is claimed are defined as follows:

1. A testing device configured to measure a characteristic of an electrical conductor, the testing device comprising:
   a substrate having at least one flexible portion;
   at least one sensor located on the flexible portion of the substrate, wherein in operation the at least one sensor generates a signal indicative of the characteristic of the electrical conductor being measured;
   a holding mechanism that holds the testing device to an outer portion of the electrical conductor being measured, wherein the at least one flexible portion of the substrate and the at least one sensor located on the flexible portion of the substrate are positioned on an inner surface of the holding mechanism; and
   a spacer separate from the holding mechanism that is used in conjunction with the holding mechanism to hold the electrical conductor being measured in position with respect to the at least one sensor on the substrate,
   wherein a portion of the holding mechanism is positionable around the spacer and the electrical conductor being measured to hold the spacer adjacent to the electrical conductor, and when the spacer is placed inside the holding mechanism adjacent to the electrical conductor being measured, the spacer occupies a space within the portion of the holding mechanism such that the at least one sensor is held in position with respect to the electrical conductor.

2. The testing device of claim 1, wherein the outer portion of the electrical conductor is one or more of electrical shielding or insulation.

3. The testing device of claim 1, wherein the entire substrate is flexible.

4. The testing device of claim 1, wherein the substrate comprises at least one rigid portion and at least one sensor is located on the at least one rigid portion.

5. The testing device of claim 1, wherein the substrate comprises a plurality of rigid portions with the at least one flexible portion extending between the plurality of rigid portions.

6. The testing device of claim 5, wherein at least one of the plurality of rigid portions is a rigid printed circuit board, and wherein the at least one sensor is located on the rigid printed circuit board.

7. The testing device of claim 1, further comprising:
   an electrical connection configured to be coupled to a computing device, wherein the computing device is configured to receive, via the electrical connection, the signal indicative of the characteristic of the electrical conductor generated by the at least one sensor.

8. The testing device of claim 1, further comprising:
   a wireless transmitter configured to send a wireless signal to a computing device, wherein the wireless signal is based on the signal indicative of the characteristic of the electrical conductor generated by the at least one sensor.

9. The testing device of claim 8, further comprising:
   a microprocessor configured to process the signal indicative of the characteristic of the electrical conductor generated by the at least one sensor, wherein the wireless signal comprises the processed signal indicative of the characteristic of the electrical conductor.

10. The testing device of claim 9, wherein the microprocessor is located on the substrate.

11. The testing device of claim 9, further comprising:
    a power source located on the substrate, wherein the power source is configured to power one or more of the wireless transmitter and the microprocessor.

12. The testing device of claim 1, wherein the holding mechanism is configured to be wrapped around the electrical conductor.

13. The testing device of claim 1, further comprising:
electromagnetic shielding located such that, when the holding mechanism holds the testing device to the outer portion of the electrical conductor, the at least one sensor is located between the electrical conductor and the electromagnetic shielding.

14. The testing device of claim 13, wherein the electromagnetic shielding is configured to attenuate an electromagnetic field generated by an electrical component other than the electrical conductor before the electromagnetic field reaches the at least one sensor.

15. A testing device configured to measure a characteristic of an electrical conductor, the testing device comprising:
a substrate having at least one flexible portion;
at least one sensor located on the substrate, wherein the at least one sensor is configured to generate a signal indicative of the characteristic of the electrical conductor being measured;
a holding mechanism configured to hold the testing device to an outer portion of the electrical conductor being measured such that the at least one sensor is held in a position with respect to the electrical conductor;
at least one overlap marker located on one of the substrate or the holding mechanism; and
a microprocessor configured to determine an amount of overlap of the testing device based on a position of the at least one overlap marker when the substrate or the holding mechanism is located around the electrical conductor and determine an estimated size of the electrical conductor based on the determined amount of overlap.

16. The testing device of claim 1, wherein the at least one sensor comprises a plurality of sensors.

17. The testing device of claim 16, wherein the holding mechanism is configured such that the sensors in the plurality of sensors are held in particular axial positions with respect to the electrical conductor.

18. A testing device configured to measure a characteristic of an electrical conductor, the testing device comprising:
a substrate having at least one flexible portion;
at least one sensor located on the substrate, wherein in operation the at least one sensor generates a signal indicative of the characteristic of the electrical conductor being measured;
a holding mechanism that holds the testing device to an outer portion of the electrical conductor being measured; and
a spacer separate from the holding mechanism that, when placed inside the holding mechanism adjacent to the electrical conductor being measured, the spacer occupies a space within the holding mechanism such that the at least one sensor is held in position with respect to the electrical conductor,
wherein the holding mechanism comprises a spring mechanism in the form of a spring clip that, when placed around the electrical conductor being measured, biases the electrical conductor and holds a portion of the electrical conductor at a particular location with respect to the at least one sensor.

19. The testing device of claim 18, wherein the entire substrate is flexible.

20. The testing device of claim 18, wherein at least one sensor is located on the at least one flexible portion.

21. The testing device of claim 18, wherein the substrate comprises at least one rigid portion and the at least one sensor is located on the at least one rigid portion.

22. The testing device of claim 1, wherein the holding mechanism includes a spring mechanism in the form of a spring clip that is configured to bias a portion of the testing device toward the electrical conductor being measured.

23. The testing device of claim 22, wherein the holding mechanism has a curved portion that forms the spring clip and holds the electrical conductor.

24. The testing device of claim 1, wherein the spacer is filled with a compliant material that does not interfere with measurements made by the at least one sensor.

25. The testing device of claim 24, wherein the compliant material is a gel, a liquid, a gas, or a non-rigid foam.

* * * * *